(12) United States Patent
Park et al.

(10) Patent No.: US 10,693,304 B2
(45) Date of Patent: Jun. 23, 2020

(54) ENERGY STORAGE SYSTEM WITH IMPROVED OPERATING TIME AND OPERATION METHOD THEREOF

(71) Applicant: Industry-Academic Cooperation Foundation, Yonsei University, Seoul (KR)

(72) Inventors: Jung-Wook Park, Seoul (KR); Jinah Noh, Seoul (KR); SeokJu Kang, Seoul (KR); Seoung Uk Jeon, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 227 days.

(21) Appl. No.: 15/880,494

(22) Filed: Jan. 25, 2018

(65) Prior Publication Data

US 2019/0058340 A1 Feb. 21, 2019

(30) Foreign Application Priority Data

Aug. 17, 2017 (KR) .......................... 10-2017-0104245

(51) Int. Cl.
*H02J 7/00* (2006.01)
*G01R 11/00* (2006.01)
(Continued)

(52) U.S. Cl.
CPC ............ *H02J 7/0047* (2013.01); *G01R 11/00* (2013.01); *G01R 31/382* (2019.01); *H02J 3/32* (2013.01);
(Continued)

(58) Field of Classification Search
CPC .............. H02J 7/0047; H02J 2007/004; H02J 2007/0037; H02J 2007/005; H02J 3/32;
(Continued)

(56) References Cited

U.S. PATENT DOCUMENTS

| 2011/0175451 A1* | 7/2011 | Moon .................... | H02J 9/062 307/66 |
| 2015/0115715 A1* | 4/2015 | Chung .................... | H02J 3/28 307/23 |
| 2017/0324268 A1* | 11/2017 | Hanada .................... | H02J 3/32 |

FOREIGN PATENT DOCUMENTS

| JP | 09-065588 A | 3/1997 |
| JP | 2002-034162 A | 1/2002 |

(Continued)

*Primary Examiner* — Drew A Dunn
*Assistant Examiner* — Sailesh Thapa
(74) *Attorney, Agent, or Firm* — Rabin & Berdo, P.C.

(57) ABSTRACT

Provided are a system and a method which allow an improved operating time of an energy storage system in a power system by reflecting a state of charge of a battery and a state of the power system on a control of an amount of charging power or discharging power of the energy storage system. The system includes: a battery configured to charge or discharge power; a battery monitor configured to monitor a state of the battery; a power system monitor configured to monitor a state of a power system; and a charge/discharge controller configured to control an amount of charging power or an amount of discharging power of the battery using a state of charge of the battery detected by the battery monitor and the state of the power system detected by the power system monitor.

12 Claims, 6 Drawing Sheets

(51) Int. Cl.
   *G01R 31/382* (2019.01)
   *H02J 7/04* (2006.01)
   *H02J 3/32* (2006.01)

(52) U.S. Cl.
   CPC ............ *H02J 7/0077* (2013.01); *H02J 7/042* (2013.01); *H02J 7/0048* (2020.01); *H02J 7/00302* (2020.01); *H02J 7/00306* (2020.01)

(58) Field of Classification Search
   CPC .......... H02J 7/0077; H02J 7/042; H02J 3/382; H02J 7/045; G01R 31/382; G01R 11/00; Y02B 90/222; Y04S 10/123; Y04S 10/14
   See application file for complete search history.

(56) References Cited

FOREIGN PATENT DOCUMENTS

| | | | |
|---|---|---|---|
| JP | 2002034162 | * | 1/2002 |
| KR | 10-2011-0084751 A | | 7/2011 |
| KR | 10-1539728 B1 | | 7/2015 |
| KR | 10-2016-0109530 A | | 9/2016 |

* cited by examiner

ENERGY STORAGE SYSTEM WITH IMPROVED OPERATING TIME AND OPERATION METHOD THEREOF

CROSS-REFERENCE TO RELATED APPLICATION

This application claims priority to and the benefit of Korean Patent Application No. 10-2017-0104245, filed on Aug. 17, 2017, the disclosure of which is incorporated herein by reference in its entirety.

STATEMENT REGARDING SPONSORED RESEARCH

This research was supported by the MOTIE (Ministry of Trade, Industry, and Energy), Korea, under the Smart Grid Program (No. 20171220100330) supervised by the KETEP (the Korea Institute of Energy Technology Evaluation and Planning).

Also this research was supported the MSIT (Ministry of Science and ICT), Korea, under the Mid-career Researcher Program (No. 2016R1E1A1A02920095) supervised by the NRF (National Research Foundation)

BACKGROUND

1. Field of the Invention

The present invention relates to an energy storage system with an improved operating time, and an operation method thereof, and more particularly, to a system and a method which allow an improved operating time of an energy storage system in a power system by reflecting a state of charge of a battery and a state of the power system on a control of an amount of charging or discharging power of the energy storage system.

2. Discussion of Related Art

Recently, as fossil fuels have been depleted, interest in new and renewable energy is rapidly growing. The new and renewable energy is a combination term of new energy and renewable energy, and refers to energy produced by converting existing fossil fuels or converting renewable energy including sunlight, water, geothermal heat, and biological organisms. Renewable energy includes solar thermal energy, photovoltaic power, biomass power, wind power, small hydro power, geothermal power, and the like, and new energy includes fuel cells, coal liquefied gasification, hydrogen energy, and the like.

Since such new and renewable energy is generated using natural or climatic conditions such as sunlight, biological organisms, wind power, tidal power, hydraulic power, or geothermal heat, its use condition frequently changes depending on a natural environment or the climatic conditions. Accordingly, the new and renewable energy has problems in that it is difficult to establish an economic electricity supply plan in accordance with an amount of generation as well as control the amount of generation in comparison to existing thermal power generation.

In order to solve the above problems, many technologies for stabilizing fluctuating unstable power from new and renewable energy sources have been rapidly developed. A typical example of such technologies is a battery energy storage system (BESS) which stores surplus power of a system in a battery or supplies insufficient power to the system from the battery.

Such a BESS is managed by an energy management system (EMS) which manages energy of a system and various types of power plants supplying energy to the system.

The EMS collects an amount of power generated by a power generation apparatus from a power meter and determines a power command value on the basis of the collected data. Also, the EMS determines whether to charge or discharge a battery by comparing the power command value and the amount of power generated by the power generation apparatus which is measured in real time. In this case, the power command value is a value for system stabilization and represents a power to be output to the system.

The BESS supplies power to the system by charging power to the battery or discharging power from the battery according to the EMS's determination of whether to charge or discharge the battery.

However, since the energy storage system employing the above system determines charging and discharging in consideration of only the maximum charge amount and the maximum discharge amount of the battery for safety, a time for which the energy storage system can affect the power system is relatively short, and hence there has been a problem in that efficiency of the energy storage system is low compared to a construction cost thereof.

RELATED ART DOCUMENT

Patent Document (Patent Document 1): Korean Patent Registration No. 10-1539728

SUMMARY OF THE INVENTION

An objective of the present invention is to provide a system and a method which allow an improved operating time of an energy storage system in a power system by reflecting a state of charge of a battery and a state of the power system on a control of an amount of charging or discharging power of the energy storage system.

In one general aspect, there is provided an energy storage system for charging or discharging power generated by a power plant, the energy storage system including: a battery configured to charge or discharge power; a battery monitor configured to monitor a state of the battery; a power system monitor configured to monitor a state of a power system; and a charge/discharge controller configured to control an amount of charging power or an amount of discharging power of the battery using a state of charge of the battery detected by the battery monitor and the state of the power system detected by the power system monitor.

The charge/discharge controller may use a preset control adjustment line when controlling the amount of charging power or the amount of discharging power.

The control adjustment line may include an upper limit adjustment line and a lower limit adjustment line, and the charge/discharge controller may reduce the amount of charging power when controlling the amount of charging power and the state of charge of the battery is a value of the upper limit adjustment line or more, and reduce the amount of discharging power when controlling the amount of discharging power and the state of charge of the battery is a value of the lower limit adjustment line or less.

The charge/discharge controller may further reduce the amount of charging power as a difference between the state of charge of the battery and the value of the upper limit adjustment line is increased at a time at which the amount of charging power is controlled, and may further reduce the amount of discharging power as a difference between the state of charge of the battery and the value of the lower limited adjustment line is increased at a time at which the amount of discharging power is controlled.

The charge/discharge controller may calculate a scale amount of charging power reduction of the battery using the state of charge of the battery, a maximum charge amount of the battery, and a battery charge variable when controlling of the amount of charging power, and calculate a scale amount of discharging power reduction of the battery using the state of charge of the battery, a maximum discharge amount of the battery, and a battery discharge variable when controlling the amount of discharging power.

The charge/discharge controller may calculate the amount of charging power by applying a reference charging power ($P^c_{ref}$) and a scale amount of charging power reduction ($D_c$) of the battery to $P^c_{ref}/D_c$ when controlling the amount of charging power, and calculate the amount of discharging power by applying a reference discharging power ($P^d_{ref}$) and a scale amount of discharging power reduction ($D_d$) of the battery to $P^d_{ref}/D_d$ when controlling the amount of discharging power.

A plurality of batteries may be present, and the charge/discharge controller may calculate an amount of charging power or an amount of discharging power for each of the batteries.

The energy storage system may be connected to the electric generator by a separate line without passing through the power system.

In another general aspect, there is provided a method of operating an energy storage system which charges or discharges power generated by a power plant, the method including: calculating, by an energy storage system, a required amount ($P_W-P_L$) of power to be charged and an amount ($P_{C\_max}$) of chargeable power of a battery or calculating a required amount ($P_L-P_W$) of power to be discharged and an amount ($P_{D\_max}$) of dischargeable power of the battery; comparing the required amount of power to be charged and the amount of chargeable power of the battery and setting a smaller value therebetween as a reference charging power, and comparing the required amount of power to be discharged and the amount of dischargeable power of the battery and setting a smaller value therebetween as a reference discharging power; and controlling an amount of charging power or discharging power of the battery according to a state of charge of the battery.

The controlling of the amount of charging power or discharging power of the battery according to the state of charge of the battery may include using a preset control adjustment line.

The control adjustment line may include an upper limit adjustment line and a lower limit adjustment line, and the controlling of the amount of charging power or discharging power of the battery according to the state of charge of the battery may include reducing the amount of charging power when controlling the amount of charging power and the state of charge of the battery is a value of the upper limit adjustment line or more, and reducing the amount of discharging power when controlling the amount of discharging power and the state of charge of the battery is a value of the lower limit adjustment line or less.

The controlling of the amount of charging power or discharging power of the battery according to the state of charge of the battery may include further reducing the amount of charging power as a difference between the state of charge of the battery and the value of the upper limit adjustment line is increased at a time at which the amount of charging power is controlled, and further reducing the amount of discharging power as a difference between the state of charge of the battery and the value of the lower limited adjustment line is increased at a time at which the amount of discharging power is controlled.

The controlling of the amount of charging power or discharging power of the battery according to the state of charge of the battery may include calculating a scale amount of charging power reduction of the battery using the state of charge of the battery, a maximum charge amount of the battery, and a battery charge variable when controlling the amount of charging power, and calculating a scale amount of discharging power reduction of the battery using the state of charge of the battery, a maximum discharge amount of the battery, and a battery discharge variable when controlling the amount of discharging power.

The controlling of the amount of charging power or discharging power of the battery according to the state of charge of the battery may include calculating the amount of charging power by applying a reference charging power ($P^c_{ref}$) and a scale amount of charging power reduction ($D_c$) of the battery to $P^c_{ref}/D_c$ when controlling the amount of charging power, and calculating the amount of discharging power by applying a reference discharging power ($P^d_{ref}$) and a scale amount of discharging power reduction ($D_d$) of the battery to $P^d_{ref}/D_d$ when and controlling the amount of discharging power.

The method may further include, before the calculating, by the energy storage system, of the required amount ($P_W-P_L$) of power to be charged or the required amount ($P_L-P_W$) of power to be discharged, determining, by the energy storage system, a power surplus or a power shortage on the basis of a difference between an amount of distributive power output and an amount of load and determining discharging of the battery in a peak period when it is determined that there is a power shortage.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

An energy storage system with an improved operating time and an operation method thereof according to embodiments of the present invention will be described in detail.

Recently, many technologies for stabilizing fluctuating unstable power from new and renewable energy sources have been rapidly developed. A typical example of such technologies is a battery energy storage system (BESS) which stores surplus power of a system in a battery or supplies insufficient power to the system from the battery.

Such a BESS is managed by an energy management system (EMS) which manages energy of a system and various types of power plants supplying energy to the system.

The EMS collects an amount of power generated by a power generation apparatus from a power meter and determines a power command value on the basis of the collected data. Also, the EMS determines whether to charge or discharge a battery by comparing the power command value and the amount of power generated by the power generation apparatus which is measured in real time. In this case, the power command value is a value for system stabilization and represents a power to be output to the system.

The BESS supplies power to the system by charging power to the battery or discharging power from the battery according to the EMS's determination of whether to charge or discharge the battery.

Figure 1:
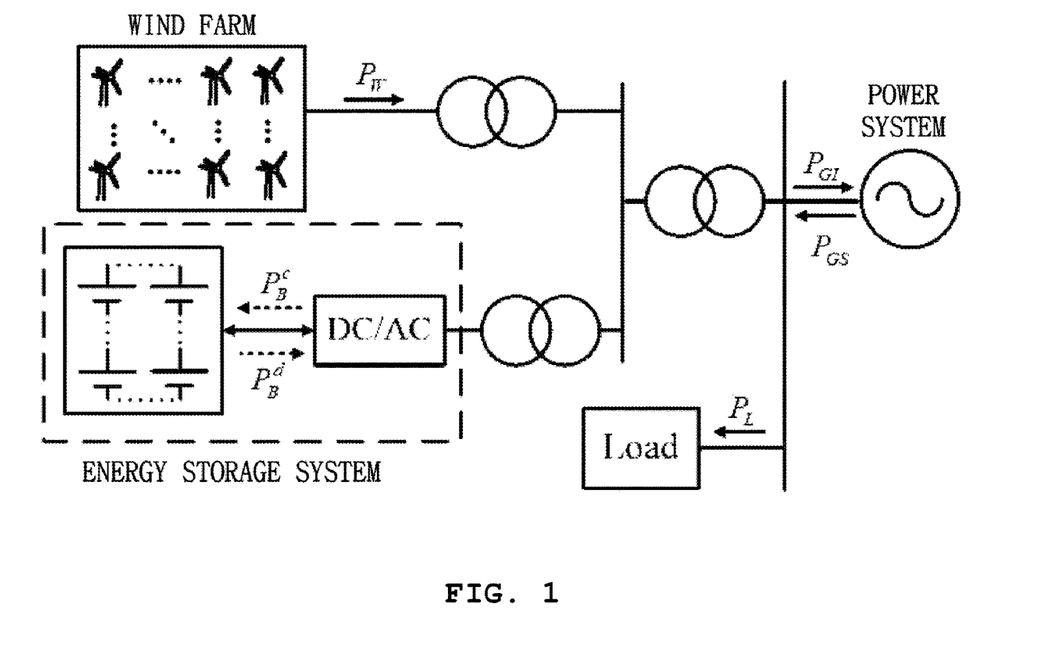
FIG. 1 is a schematic diagram of an energy storage system with an improved operating time according to one embodiment of the present invention.
Figure 2:
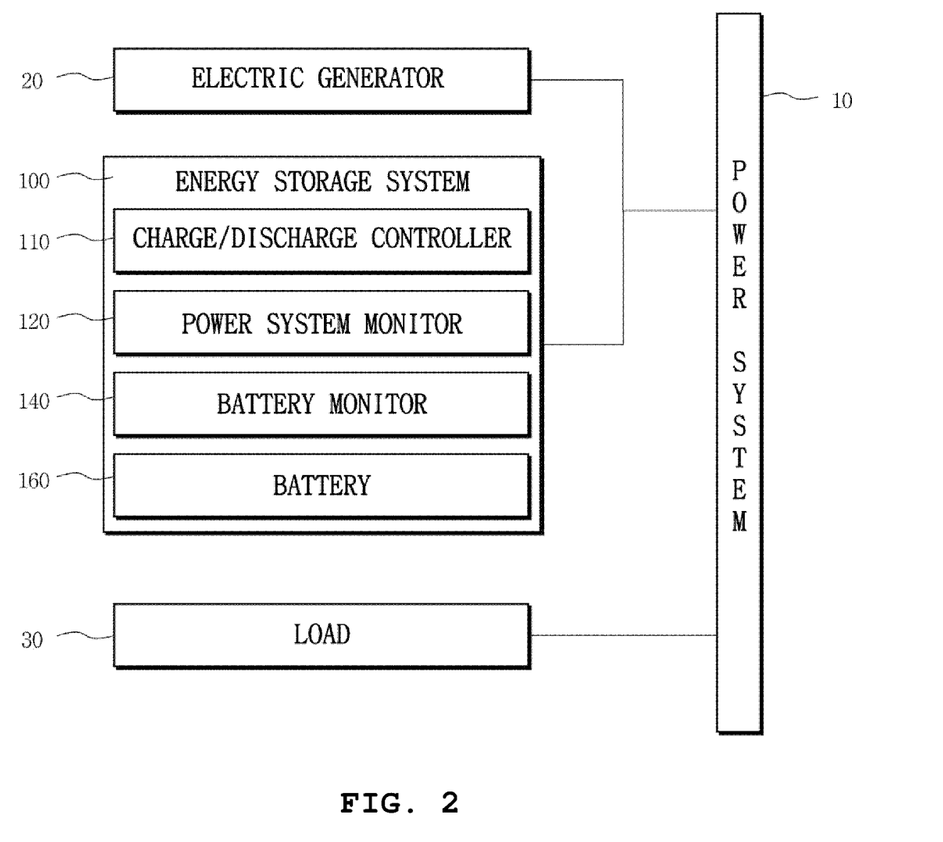
FIG. 2 is a diagram illustrating a configuration of the energy storage system with an improved operating time according to one embodiment of the present invention.

Referring to FIGS. 1 and 2, an energy storage system 100 with an improved operating time includes a battery 160 configured to charge or discharge power, a battery monitor 140 configured to monitor a state of the battery 160, a power system monitor 120 configured to monitor a state of a power system 10, and a charge/discharge controller 110 configured to control charging or discharging of the power of the battery 160 using a state of charge (SOC) of the battery 160 detected by the battery monitor 140 and the state of the power system 10 detected by the power system monitor 120.

A configuration of an embodiment of the present invention is not limited to the battery 160, the battery monitor 140, the power system monitor 120, and the charge/discharge controller 110, and it should be apparent that a configuration, such as a direct current (DC)/alternating current (AC) inverter, required for the energy storage system 100 may be further included.

An electric generator 20 may preferably generate electric power from a new and renewable energy source, such as wind power, solar power, hydroelectric power, tidal power, or the like, which has fluctuation in an amount of power generation.

The electric generator 20 supplies the generated electric power to the power system 10 through power lines. The power system 10 may include a power plant, a substation, and a transmission line, and may include a configuration for purchasing electric power, such as an electricity market. The state of the power system 10 refers to a system state, such as an amount of power flow or an amount of power demanded relative to a critical amount of power of the transmission line.

Figure 3:
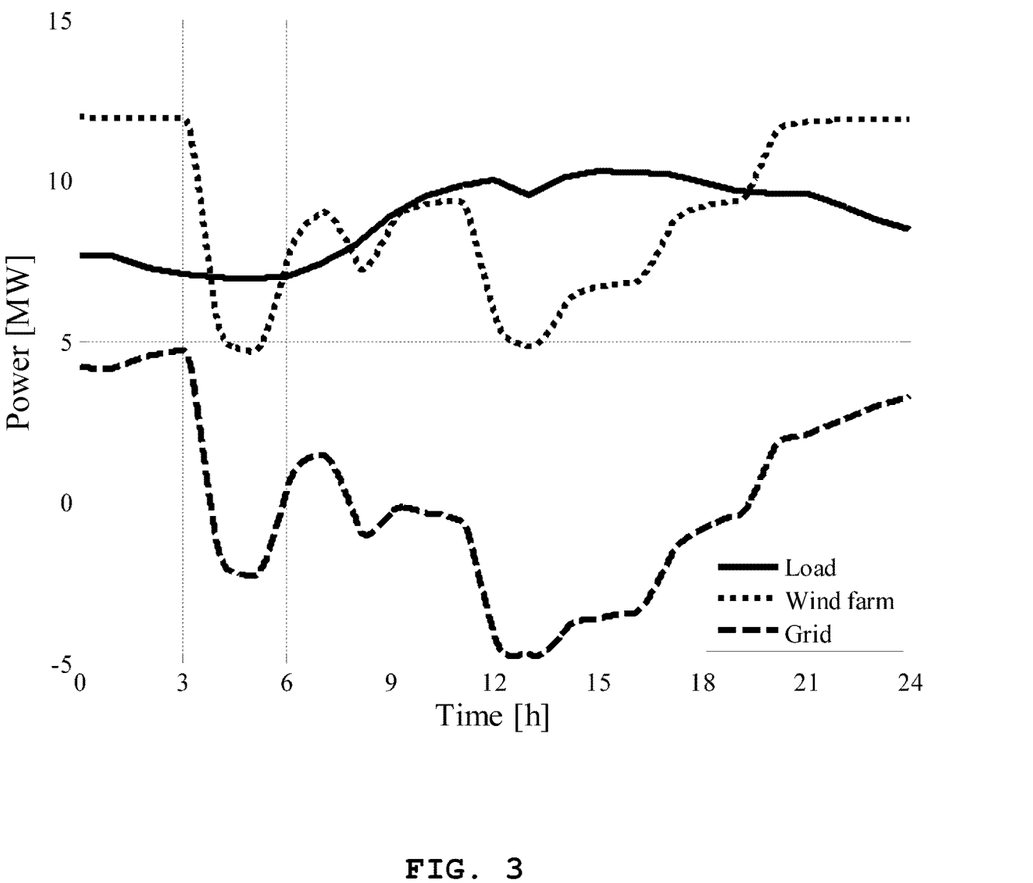
FIG. 3 is a graph showing changes in an amount of power generated by an electric generator, power of a power system, and a load over time when the electric generator is a wind electric generator.

Referring to FIG. 3, when the electric generator 20 is a wind electric generator, the power generated by the electric generator 20 shows a significantly large fluctuation in an amount of power generated over time. When the amount of power generated by the electric generator 20 exceeds an amount of power consumption for a corresponding time, generated surplus power is charged in the energy storage system 100 according to one embodiment of the present invention. In addition, when the amount of power generated by the electric generator 20 is lower than the amount of power consumption for a corresponding time, the power charged in the energy storage system 100 according to the present embodiment is discharged to the power system 10. In this case, the energy storage system 100 sets a reference charging or discharging power of the DC/AC inverter and inputs and/or outputs power corresponding to the set scale of power.

A conventional energy storage system determines whether to charge or discharge a battery 160 only by checking whether the battery is fully charged or discharged under the assumption that the battery 160 is a kind of a storage tank capable of receiving energy, whereas the charge/discharge controller 110 of the energy storage system 100 according to the present embodiment uses a pre-set control adjustment line when controlling the amount of charging/discharging of power.

The control adjustment line is an arbitrary threshold line by which an amount of charging/discharging of power is reduced when an SOC of the battery 160 is out of a predetermined range. The control adjustment line may consist of at least two lines, an upper limit adjustment line $SOC^L_{max}$ and a lower limit adjustment line $SOC^L_{min}$. A value of the upper limit adjustment line $SOC^L_{max}$ is preferably a value of a maximum charge amount $SOC_{max}$ or less, and a value of the lower limit adjustment line $SOC^L_{min}$ is preferably a value of a maximum discharge amount $SOC_{min}$ or less. A relationship among values of the SOC of the battery 160, the maximum charge amount $SOC_{max}$, the maximum discharge amount $SOC_{min}$, the upper limit adjustment line $SOC^L_{max}$, and the lower limit adjustment line $SOC^L_{min}$ may be expressed by Formula 1 below.

$$SOC_{min} \leq SOC^L_{min} \leq SOC \leq SOC^L_{max} \leq SOC_{max} \qquad \text{[Formula 1]}$$

When the SOC of the battery 160 is the value of the upper limit adjustment line $SOC^L_{max}$ or less and the value of the lower limit adjustment line $SOC^L_{min}$ or more, the amount of charging/discharging of power of the battery 160 is not reduced. Conversely, when the SOC of the battery 160, which is monitored by the battery monitor 140, is greater than value of the upper limit adjustment line $SOC^L_{max}$, the charge/discharge controller 110 reduces the amount of charging power. In addition, when the SOC of the battery 160, which is monitored by the battery monitor 140, is less than the value of the lower limit adjustment line $SOC^L_{min}$, the charge/discharge controller 110 reduces the amount of discharging power.

In particular, as a difference $SOC^L_{min} - SOC$ between the value of the lower limit adjustment line $SOC^L_{min}$ and the SOC of the battery 160 is increased at a time at which the amount of charging power is controlled or a difference $SOC - SOC^L_{max}$ between the SOC of the battery 160 and the value of the upper limit adjustment line $SOC^L_{max}$ is increased at a time at which the amount of discharging power is controlled, the charge/discharge controller 110 may further reduce the amount of charging or discharging power in proportion to the difference.

The charge/discharge controller 110 may perform reduction by obtaining a scale amount of charging power reduction and a scale amount of discharging power reduction using formulas below.

When the SOC of the battery 160 is the value of the lower limit adjustment line $SOC^L_{min}$ or less while discharging, the charge/discharge controller 110 calculates a scale amount of discharging power reduction $D_d$ of the battery 160 by applying the SOC of the battery 160, the maximum discharge amount $SOC_{min}$ of the battery 160, and a battery discharge variable ad to Formula 2 below.

$$D_d = \left[\frac{a_d}{(SOC - SOC_{min})^2}\right] \quad \text{[Formula 2]}$$

In addition, when the SOC of the battery 160 is the value of the upper limit adjustment line $SOC^L_{max}$ or more, the charge/discharge controller 110 calculates a scale amount of charging power reduction $D_c$ of the battery 160 by applying the SOC of the battery 160, the maximum charge amount $SOC_{max}$ of the battery 160, and a battery charge variable $\alpha_c$ to Formula 3 below.

$$D_c = \left[\frac{a_c}{(SOC - SOC_{max})^2}\right] \quad \text{[Formula 3]}$$

Here, c denotes charging and d denotes discharging.

The battery charge variable $\alpha_c$ and the battery discharge variable $\alpha_d$ are variables that are variably set according to a capacity of the battery 160 or specifications of the system.

In another embodiment, each of the scale amount of charging power reduction $D_c$ and the scale amount of discharging power reduction $D_d$ may be increased by 1 as shown in Formula 4 to always be a constant value greater than 1.

$$D_c = 1 + \left[\frac{a_c}{(SOC - SOC_{max})^2}\right] \quad \text{[Formula 4]}$$
$$D_d = 1 + \left[\frac{a_d}{(SOC - SOC_{min})^2}\right]$$

Occasionally, a delay in operation of the battery monitor 140 or the power system monitor 120 occurs, which results in a value of the denominator becoming zero. Such a situation causes a system error. In order to prevent this situation, it is preferable to modify the scales of reduction by adding a very small value to each of the denominators as shown in Formula 5.

$$D_c = 1 + \left[\frac{a_c}{(SOC - SOC_{max})^2 + 10^{-6}}\right] \quad \text{[Formula 5]}$$
$$D_d = 1 + \left[\frac{a_d}{(SOC - SOC_{min})^2 + 10^{-6}}\right]$$

Lastly, the charge/discharge controller 110 calculates the amount of power discharge by dividing a reference discharging power $P^d_{ref}$ by the scale amount of discharging power reduction $D_d$ of the battery 160.

$$\frac{P^d_{ref}}{D_d} \quad \text{[Formula 6]}$$

A value of the scale amount of discharging power reduction used for calculating the amount of discharging power is increased as the SOC of the battery 160 nears the maximum discharge amount, and thus the energy storage system 100 is allowed to provide power to the power system 10 for a longer period of time when the power system 10 needs power.

In addition, the charge/discharge controller 110 calculates the amount of charging power by dividing a reference charging power $P^c_{ref}$ by the scale amount of charging power reduction $D_c$ of the battery 160.

$$\frac{P^c_{ref}}{D_c} \quad \text{[Formula 7]}$$

A value of the scale amount of charging power reduction used for calculating the amount of charging power is increased as the SOC of the battery 160 nears the maximum charge amount, and thus the energy storage system 100 can participate in the power system 10 for a longer period of time since the generated surplus power is charged for a longer period of time.

The reference charging power is obtained by selecting a smaller value from a required amount of power to be charged and the amount of chargeable power of the battery 160. It should be apparent that the amount of chargeable power of the battery 160 is a difference obtained by subtracting the SOC of the battery 160 from the maximum charge amount of the battery 160. The reference discharging power is obtained by selecting a smaller value from a required amount of power to be discharged and the amount of dischargeable power of the battery 160. It should be apparent that the amount of dischargeable power of the battery 160 refers to the SOC of the battery 160. The reference charging power and the reference discharging power are set by the charge/discharge controller 110.

The required amount of power to be charged refers to an amount of surplus power occurring when an amount of power generated by the electric generator 20 is large relative to a load 30 of the power system 10, and the required amount of power to be discharged refers to an amount of power shortage occurring when the amount of power generated by the electric generator 20 is small relative to the load 30 of the power system 10. The required amount of power to be charged and the required amount of power to be discharged are set by the energy storage system 100.

When the energy storage system 100 includes a plurality of batteries 160, the charge/discharge controller 110 may calculate an amount of charging and/or discharging power for each of the batteries 160.

In addition, referring to FIG. 2, the energy storage system 100 of the present embodiment may be connected to the electric generator 20 by a separate line without passing through the power system 10.

Hereinafter, a method of operating the energy storage system 100 according to one embodiment of the present invention will be described in detail.

Figure 4:
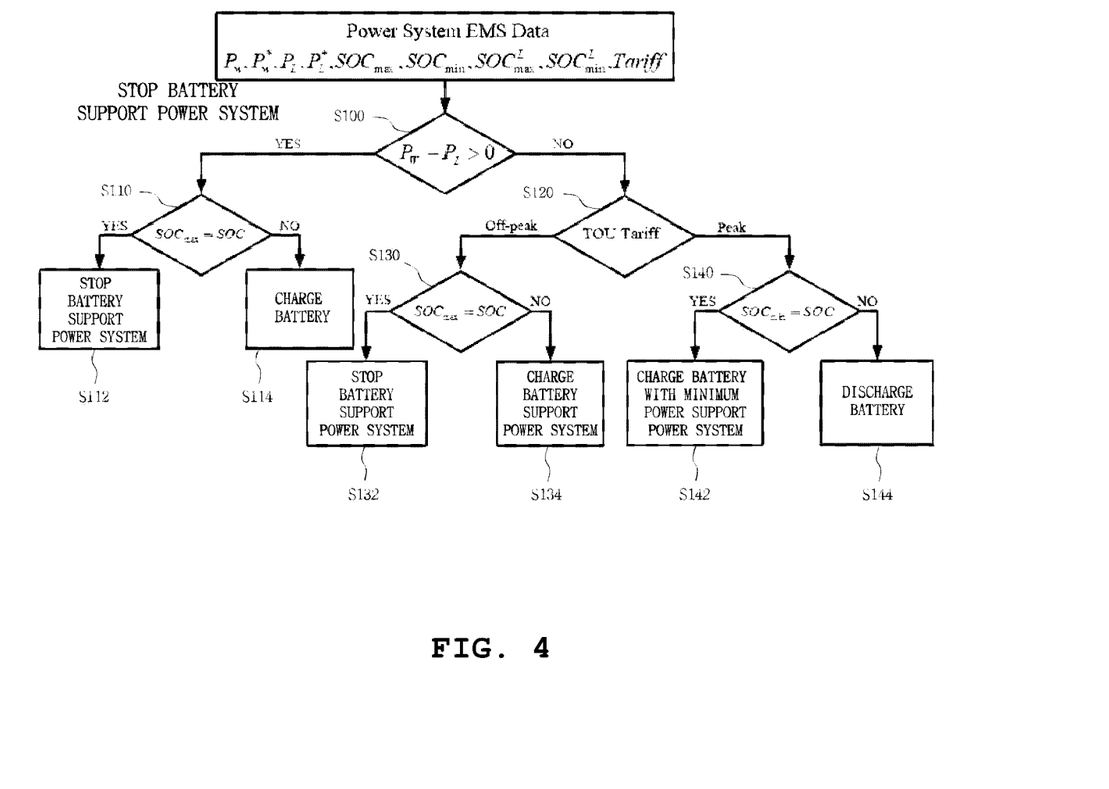
FIG. 4 is a flowchart illustrating a process of selecting charging or discharging by the energy storage system.

Referring to FIG. 4, in the method of operating an energy storage system according to one embodiment of the present invention, charging/discharging is determined on the basis of an amount of distributive power output, a load, a maximum charge amount of a battery, a maximum discharge amount of the battery, an SOC of the battery, a time-of-use (TOU) tariff, and the like. First, a difference between an amount of distributive power output $P_W$ and the load $P_L$ is checked (S100). The value obtained in S100 being a positive number indicates that surplus power exists. The maximum charge amount $SOC_{max}$ of the battery is compared with a current SOC of the battery (S110), and when they are equal, operation of the battery is stopped and the difference between the amount of distributive power output $P_W$ and the load $P_L$ is provided to a power system (S112), and when the maximum charge amount $SOC_{max}$ of the battery is not the same as the current SOC, the difference between the amount of distributive power output $P_W$ and the load $P_L$ is used for charging the battery (S114).

The value obtained in S100 being a negative number indicates a power shortage. By taking into consideration a TOU tariff (S120), the maximum charge amount $SOC_{max}$ of the battery and the current SOC of the battery are compared in an off-peak period in which a power rate of the power system is low (S130). When the maximum charge amount $SOC_{max}$ is equal to the current SOC, operation of the battery is stopped and an insufficient amount of power of the power system is supplemented (S132), and when the two amounts are not the same, the battery is charged from the power system and power is supplied to a load from a connected system (S134). The maximum discharge amount $SOC_{min}$ of the battery is compared with the SOC of the battery in a peak period in which the power rate of the power system is high (S140). When the maximum discharge amount $SOC_{min}$ of the battery is equal to the SOC, the battery is charged with a minimum power of the power system (S142), and otherwise, the battery is discharged to supplement an insufficient amount of power caused by a load (S144).

Figure 5:
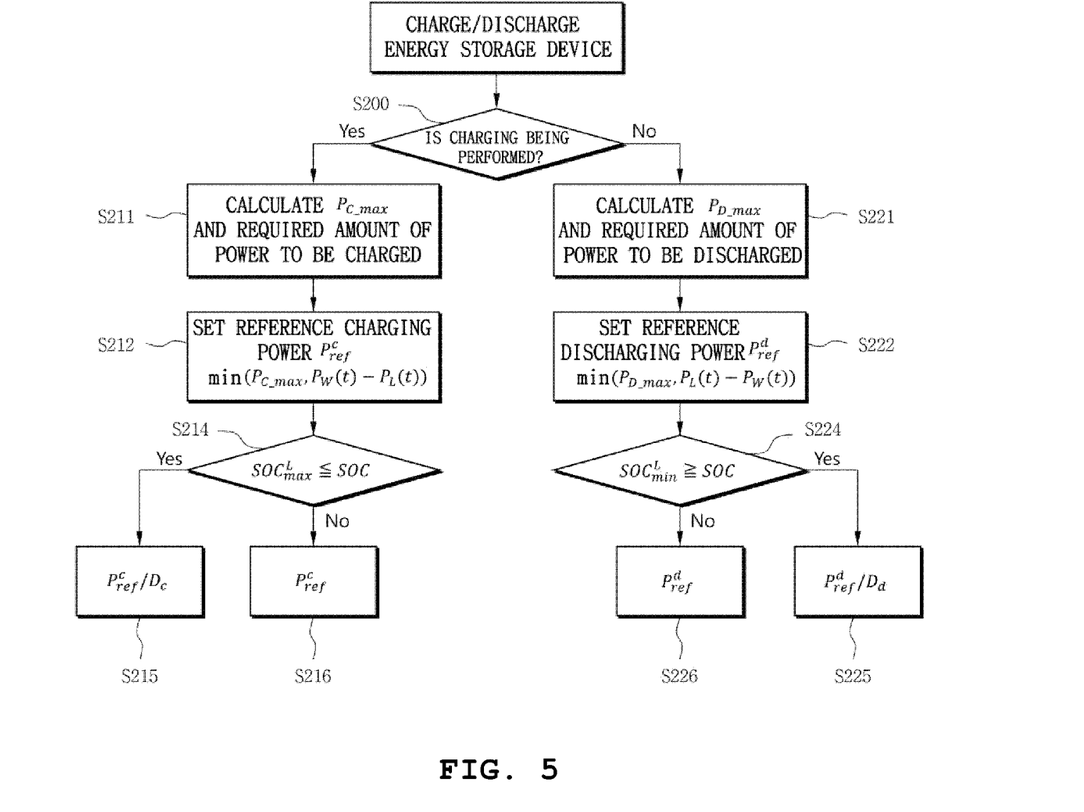
FIG. 5 is a flowchart illustrating a process of setting an amount of charging power or discharging power in a method of operating an energy storage system according to one embodiment of the present invention.

Referring to FIG. 5, the method of operating an energy storage system of the present embodiment selects whether the battery 160 is to be charged with power generated by an electric generator or power charged in the battery 160 is discharged to the power system 10 (S200). The selection of charging or discharging of the battery 160 is performed on the basis of a state of the power system 10, whether the battery 160 can be charged, or the like, and the selection may be performed using a process shown in FIG. 4.

When charging of the battery 160 is selected, the energy storage system 100 calculates a required amount of power to be charged $P_W-P_L$ and the amount $P_{C\_max}$ of chargeable power of the battery (S211).

Then, the charge/discharge controller 110 compares the required amount of power to be charged and the amount of chargeable power of the battery 160 and sets a smaller value therebetween as a reference charging power (S212). The amount of chargeable power of the battery 160 is checked by the battery monitor 140.

When the reference charging power is set, the charge/discharge controller 110 controls the amount of charging power of the battery 160 using a preset upper limit adjustment line. Specifically, the charge/discharge controller 110 checks whether the SOC of the battery 160 is the value of the preset upper limit adjustment line $SOC^L_{max}$ or more (S214). The SOC of the battery 160 is continuously and repeatedly checked, and the comparison to the upper limit adjustment line is repeated. When the SOC of the battery 160 is less than the value of the upper limit adjustment line $SOC^L_{max}$, the charge/discharge controller 110 controls the amount of charging power of the battery 160 to be the same as the charge power scale $P^c_{ref}$ (S216). However, when the SOC of the battery 160 is the value of the upper limit adjustment line $SOC^L_{max}$ or more, the charge/discharge controller 110 controls the amount of charging power of the battery 160 according to the SOC of the battery 160 and the state of the power system 10 (S215). Because a control adjustment line is used as a basis for determining whether the amount of charging power is controlled, it should be understood that the control adjustment line is preferably used for controlling the amount of charging power.

In particular, when the SOC of the battery 160 is the value of the upper limit adjustment line or more, the charge/discharge controller 110 reduces the amount of charging power. As a difference between the SOC of the battery 160 and the upper limit adjustment line increases, the amount of charging power is reduced.

The scale amount of charging power reduction $D_c$ of the battery 160 for the charge/discharge controller 110 to calculate the amount of charging power is calculated using the SOC of the battery 160, the maximum charge amount $SOC_{max}$ of the battery 160, and the battery charge variable $\alpha_c$. The charge/discharge controller 110 calculates the amount of charging power by dividing the reference charging power by the scale amount of charging power reduction of the battery 160.

Meanwhile, when discharging of the battery 160 is selected in S200, the energy storage system 100 calculates the required amount $P_L-P_W$ of power to be discharged and the amount $P_{D\_max}$ of dischargeable power (S221).

Then, the charge/discharge controller 110 compares the required amount of power to be discharged and the amount of dischargeable power of the battery 160 and sets a smaller value therebetween as the reference discharging power (S222).

When the reference discharging power is set, the charge/discharge controller 110 controls the amount of discharging power of the battery 160 using the preset lower limit adjustment line. Specifically, the charge/discharge controller 110 checks whether the SOC of the battery 160 is the value of the preset lower limit adjustment line $SOC^L_{min}$ or less (S224). When the SOC of the battery 160 exceeds the value of the lower limit adjustment line $SOC^L_{min}$, the charge/discharge controller 110 controls the amount of discharging power of the battery 160 to be the same as the reference discharging power $P^d_{ref}$ (S226). However, when the SOC of the battery 160 is the value of the lower limit adjustment line $SOC^L_{min}$ or less, the charge/discharge controller 110 controls the amount of discharging power of the battery 160 using the SOC of the battery 160 and the state of the power system 10 (S225).

Particularly, when the SOC of the battery 160 is the value of the lower limit adjustment line or less, the charge/discharge controller 110 reduces the amount of discharging power. As a difference between the value of the lower limit adjustment line and the SOC of the battery 160 is increased, the amount of discharging power is reduced.

The scale amount of discharging power reduction $D_d$ of the battery 160 for the charge/discharge controller 110 to calculate the amount of discharging power is calculated using the SOC of the battery 160, the maximum discharge amount $SOC_{min}$ of the battery 160, and the battery discharge variable ad. The charge/discharge controller 110 calculates the amount of discharging power by dividing the reference discharging power by the scale amount of discharging power of the battery 160.

[Simulation]

Figure 6:
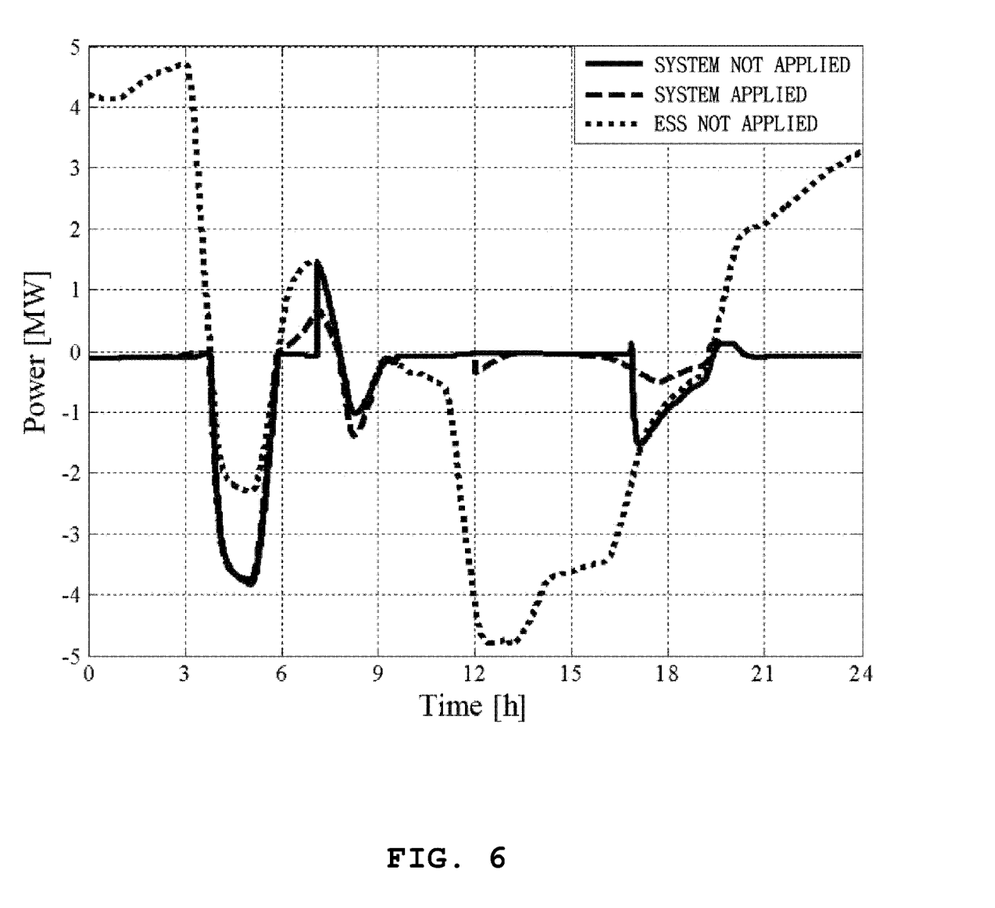
FIG. 6 is a graph simulating power variations in an energy storage system according to one embodiment of the present invention, in a conventional energy storage system, and in a power system which does not employ an energy storage system.

Referring to FIG. 6, a state of power (dotted line) of the power system 10 which does not employ the energy storage system 100, a state of power (solid line) of the power system 10 to which a conventional energy storage system was applied, and a state of power (dashed line) of the power system 10 to which the energy storage system 100 according to one embodiment of the present invention was applied were simulated for 24 hours. It is assumed that each of the powers is under the same conditions of time, generation amount, and the load 30.

The power (dotted line) of the power system that does not employ the energy storage system 100 was very uneven since changes in the amount of power generation and load 30 over time were reflected in the power.

When the power (solid line) of the power system to which the conventional energy storage system was applied is compared with the power (dashed line) of the power system to which the energy storage system 100 according to one embodiment of the present invention was applied, it was observed that, in a time interval from hour 6 to hour 8, the conventional energy storage system was fully charged around hour 7 and did not properly operate from hour 7 to hour 9, and accordingly the power appeared the same as the power in the case in which the energy storage system 100 was omitted. However, according to one embodiment of the present invention, in the same time interval, the amount of charging power was reduced as a full charge was nearly reached, thereby inducing the power of the power system 10 to slowly change until hour 9 and affecting the power system 10 for a longer period of time.

In addition, when the power decreased after hour 9, the conventional energy storage system continuously discharged the charged power and was fully discharged around hour 17 and could not influence the power system 10 until hour 18.5. In contrast, the energy storage system 100 according to one embodiment of the present invention gradually reduced the amount of discharging power from around hour 15 and could affect the power system 10 until hour 18.5.

According to the energy storage system with an improved operating time and the operation method thereof in accordance with the present invention, the following effects are achieved.

First, the energy storage system in accordance with the present invention can affect a power system for a longer period of time because a charging speed is slowed as a battery reaches a maximum charge and a discharging speed is slowed as the battery reaches a maximum discharge.

Second, since the energy storage system in accordance with the present invention can affect the power system for a longer period of time, it is possible to sell a larger amount of power at a time when a price of the power is high.

Third, when constructing a new and renewable energy power plant, it is possible to support improved power by applying a minimum energy storage system to an environment in which a scale of an energy storage system is standardized relative to a scale of a power plant, thereby reducing costs for constructing the power system.

The above description of the invention is for illustrative purposes, and a person having ordinary skilled in the art should appreciate that other specific modifications may be easily made without departing from the technical spirit or essential features of the invention.

Therefore, the above embodiments should be regarded as illustrative rather than limitative in all aspects. The scope of the present disclosure is not defined by the detailed description as set forth above, but by the accompanying claims of the invention. It should also be understood that all changes or modifications derived from the definitions and scope of the claims and their equivalents fall within the scope of the invention.

What is claimed is:

1. An energy storage system for charging or discharging power generated by a power plant, the energy storage system comprising:
    a battery configured to charge or discharge power;
    a battery monitor configured to monitor a state of the battery;
    a power system monitor configured to monitor a state of a power system; and
    a charge/discharge controller configured to control an amount of charging power or an amount of discharging power of the battery using a state of charge of the battery detected by the battery monitor and the state of the power system detected by the power system monitor,
    wherein the charge/discharge controller uses a preset control adjustment line when controlling the amount of charging power or the amount of discharging power, the control adjustment line including an upper limit adjustment line and a lower limit adjustment line,
    wherein the charge/discharge controller reduces the amount of charging power when controlling the amount of charging power and the state of charge of the battery is a value of the upper limit adjustment line or more, and reduces the amount of discharging power when controlling the amount of discharging power and the state of charge of the battery is a value of the lower limit adjustment line or less,
    wherein the charge/discharge controller calculates a scale amount of charging power reduction of the battery using the state of charge of the battery, a maximum charge amount of the battery, and a battery charge variable when controlling the amount of charging power, and calculates a scale amount of discharging power reduction of the battery using the state of charge of the battery, a maximum discharge amount of the battery, and a battery discharge variable when controlling the amount of discharging power.

2. The energy storage system of claim 1, wherein the charge/discharge controller further reduces the amount of charging power as a difference between the state of charge of the battery and the value of the upper limit adjustment line is increased at a time at which the amount of charging power is controlled, and further reduces the amount of discharging power as a difference between the state of charge of the battery and the value of the lower limited adjustment line is increased at a time at which the amount of discharging power is controlled.

3. The energy storage system of claim 1, wherein the charge/discharge controller calculates the amount of charging power by applying a reference charging power ($P^c_{ref}$) and a scale amount of charging power reduction ($D_c$) of the battery to $P^c_{ref}/D_c$ when controlling the amount of charging power, and calculates the amount of discharging power by applying a reference discharging power ($P^d_{ref}$) and a scale amount of discharging power reduction ($D_d$) of the battery to $P^d_{ref}/D_d$ when controlling the amount of discharging power.

4. The energy storage system of claim 1, wherein a plurality of batteries are present, and the charge/discharge controller calculates an amount of charging power or an amount of discharging power for each of the batteries.

5. The energy storage system of claim 1, wherein the energy storage system is connected to the electric generator by a separate line without passing through the power system.

6. A method of operating an energy storage system which charges or discharges power generated by a power plant, the method comprising:
- calculating, by an energy storage system, a required amount ($P_W-P_L$) of power to be charged and an amount ($P_{C\_max}$) of chargeable power of a battery or calculating a required amount ($P_L-P_W$) of power to be discharged and an amount ($P_{D\_max}$) of dischargeable power of the battery;
- comparing the required amount of power to be charged and the amount of chargeable power of the battery and setting a smaller value therebetween as a reference charging power, and comparing the required amount of power to be discharged and the amount of dischargeable power of the battery and setting a smaller value therebetween as a reference discharging power; and
- controlling an amount of charging power or discharging power of the battery according to a state of charge of the battery.

7. The method of claim 6, wherein the controlling of the amount of charging power or discharging power of the battery according to the state of charge of the battery includes using a preset control adjustment line.

8. The method of claim 7, wherein the control adjustment line includes an upper limit adjustment line and a lower limit adjustment line, and the controlling of the amount of charging power or discharging power of the battery according to the state of charge of the battery includes reducing the amount of charging power when controlling the amount of charging power and the state of charge of the battery is a value of the upper limit adjustment line or more, and reducing the amount of discharging power when controlling the amount of discharging power and the state of charge of the battery is a value of the lower limit adjustment line or less.

9. The method of claim 8, wherein the controlling of the amount of charging power or discharging power of the battery according to the state of charge of the battery includes further reducing the amount of charging power as a difference between the state of charge of the battery and the value of the upper limit adjustment line is increased at a time at which the amount of charging power is controlled, and further reducing the amount of discharging power as a difference between the state of charge of the battery and the value of the lower limited adjustment line is increased at a time when the amount of discharging power is controlled.

10. The method of claim 8, wherein the controlling of the amount of charging power or discharging power of the battery according to the state of charge of the battery includes calculating a scale amount of charging power reduction of the battery using the state of charge of the battery, a maximum charge amount of the battery, and a battery charge variable when controlling the amount of charging power, and calculating a scale amount of discharging power reduction of the battery using the state of charge of the battery, a maximum discharge amount of the battery, and a battery discharge variable when controlling the amount of discharging power.

11. The method of claim 10, wherein the controlling of the amount of charging power or discharging power of the battery according to the state of charge of the battery includes calculating the amount of charging power by applying a reference charging power ($P^c_{ref}$) and a scale amount of charging power reduction ($D_c$) of the battery to $P^c_{ref}/D_c$ when controlling the amount of charging power, and calculates the amount of discharging power by applying a reference discharging power ($P^d_{ref}$) and a scale amount of discharging power reduction ($D_d$) of the battery to $P^d_{ref}/D_d$ when controlling the amount of discharging power.

12. The method of claim 6, further comprising: before the calculating, by the energy storage system, of the required amount of power to be charged or the required amount of power to be discharged,
- determining, by the energy storage system, a power surplus or a power shortage on the basis of a difference between an amount of distributive power output and an amount of load; and
- determining discharging of the battery in a peak period when it is determined that there is a power shortage.

* * * * *